(12) United States Patent
Sahbari

(10) Patent No.: US 6,511,547 B1
(45) Date of Patent: Jan. 28, 2003

(54) DIBASIC ESTER STRIPPING COMPOSITION

(75) Inventor: Javad J. Sahbari, Sunnyvale, CA (US)

(73) Assignee: SiliconValley Chemlabs, Inc., Santa Clara, CA (US)

( * ) Notice: Subject to any disclaimer, the term of this patent is extended or adjusted under 35 U.S.C. 154(b) by 0 days.

(21) Appl. No.: 09/661,723

(22) Filed: Sep. 14, 2000

Related U.S. Application Data

(63) Continuation-in-part of application No. 09/328,176, filed on Jun. 8, 1999, now abandoned, which is a continuation of application No. 09/063,627, filed on Apr. 20, 1998, now Pat. No. 5,909,744, which is a continuation-in-part of application No. 08/593,628, filed on Jan. 30, 1996, now Pat. No. 5,741,368.

(51) Int. Cl.$^7$ ................................................. C23G 1/00
(52) U.S. Cl. ............................. 134/2; 134/29; 134/38; 430/260; 430/329; 510/201
(58) Field of Search ................ 134/2, 10, 38, 134/26, 29, 42, 40; 430/256, 258, 329, 260; 438/906; 510/201

(56) References Cited

U.S. PATENT DOCUMENTS

| | | | |
|---|---|---|---|
| 3,673,099 A | 6/1972 | Corgy et al. ............. | 252/156 |
| 4,438,192 A | 3/1984 | Archer et al. ............ | 430/329 |
| 4,617,251 A | 10/1986 | Sizensky ................. | 430/256 |
| 4,744,834 A | 5/1988 | Hag ...................... | 134/38 |
| 4,760,014 A | 7/1988 | Wong ..................... | 430/399 |
| 4,791,043 A | 12/1988 | Thomas et al. ............ | 430/256 |
| 4,824,763 A | 4/1989 | Lee ....................... | 430/258 |
| 4,927,556 A | 5/1990 | Pokorny .................. | 510/206 |
| 5,062,988 A | 11/1991 | Dishart et al. ............ | 510/175 |
| 5,084,200 A | 1/1992 | Dishart et al. ............ | 510/175 |
| 5,098,594 A | 3/1992 | Doscher .................. | 134/1 |
| 5,106,525 A | 4/1992 | Sullivan .................. | 510/206 |
| 5,188,675 A | 2/1993 | Dorman-Drailsford ....... | 134/4 |
| 5,196,136 A | 3/1993 | Dishart et al. ............ | 510/412 |
| 5,279,771 A | 1/1994 | Lee ....................... | 252/548 |
| 5,308,745 A | 5/1994 | Schwartzkopf ............ | 430/329 |
| 5,531,889 A | 7/1996 | Baron et al. ............. | 210/267 |
| 5,554,312 A | 9/1996 | Ward ..................... | 510/175 |
| 5,612,303 A | 3/1997 | Takayanagi et al. ........ | 510/174 |
| 5,830,836 A | * 11/1998 | Smith et al. .............. | 510/211 |
| 5,954,890 A | * 9/1999 | Smith et al. .............. | 134/38 |
| 5,994,282 A | * 11/1999 | Lallier ................... | 510/203 |

FOREIGN PATENT DOCUMENTS

| | | | |
|---|---|---|---|
| EP | 0 163 202 | 5/1985 | ............ G03F/7/26 |
| EP | 267-540 A | 10/1986 | |

\* cited by examiner

*Primary Examiner*—Randy Gulakowski
*Assistant Examiner*—M. Kornakov
(74) *Attorney, Agent, or Firm*—S. Matthew Cairns

(57) ABSTRACT

A mixture of a dibasic ester (DBE), an alcohol, a polar solvent and water to remove photoresist from a flat panel substrate. Photoresist is effectively removed at low temperature with this non-phenolic, non-halogenated stripper solution.

10 Claims, No Drawings

DIBASIC ESTER STRIPPING COMPOSITION

This application a CIP of Ser. No. 09/328,176, dated Jun. 8, 1999, now abandoned, which is a continuation of application Ser. No. 09/063,627, filed on Apr. 20, 1998 now U.S. Pat. No. 5,909,744, which is a continuation-in-part of application Ser. No. 08/593,628, filed on Jan. 30, 1996, now U.S. Pat. No. 5,741,368.

BACKGROUND OF THE INVENTION

1. Field of the Invention

This invention is directed to a composition and method for removal of photoresist materials from a substrate, such as a flat panel display. Mixtures of a dibasic ester (DBE), an alcohol, a polar organic solvent, and water are used to strip hard to remove photoresist materials, such as photoresist which has been subjected to baking process, without damaging the substrate. The method is effective at low temperatures (50–70° C.).

2. Brief Description of the Prior Art a. Integrated Circuit Processing. Photoresist materials are commonly used as coating masks in the fabrication of integrated circuits. During the fabrication process, photoresist materials are applied to a substrate using various techniques known in the art. The substrate, now coated with photoresist materials, is then exposed with radiation, usually in the UV, e-beam or x-ray wavelengths. After exposure the coated substrate is developed leaving a defined pattern of photoresist materials on the substrate. The photoresist materials that remain on the substrate after developing are used to mask the substrate for further processing. After further processing, the photoresist materials are stripped from the substrate using a photoresist stripper.

Further processing of the photoresist materials after developing, such as high temperature post exposure bake, ion implantation and deep UV radiation hardening lead to highly crosslinked photoresist materials which are extremely resistant to dissolution in most conventionally employed organic strippers. Halogenated and phenolic hydrocarbon solvents have been used to remove these extremely resistant photoresist materials. Use of these types of solvents is undesirable due to the hazards they pose to technicians carrying out the stripping process and due to the potential pollution and environmental problems associated with disposal of the waste product. Alkaline strippers have also been utilized to remove these resistant photoresist materials. Use of these types of strippers is undesirable due to the corrosion they cause to substrates containing metal films, particularly aluminum or various combinations or alloys of active metals such as copper or tungsten.

b. Flat Panel Displays (LCD/TFT). In fabricating large area panels such as LCD/TFT flat panel displays, a glass substrate is coated with photoresist material. The coated substrate is exposed to UV, e-beam or X-ray radiation. After exposure, the coated substrate is developed, leaving a defined pattern of photoresist and open areas on the substrate for further processing. After further processing, the photoresist is stripped from the substrate using a photoresist stripper.

Since the substrate is glass and not a silicon wafer, rinsability is a problem. Large area panels are more susceptible to water rinsing and water induced corrosion than silicon wafers. Therefore, during the rinse cycle thin film metal layers on the FPD can be etched and corroded due to the hydrolysis of alkaline chemicals in strippers that contain organic amines. Metals used in FPD fabrication such as ITO (indium-tin oxide), Mo, Al, Cr vs. Al—Si—Cu, W and Cu, are susceptible to pH and water induced corrosion. In IC manufacturing on silicon wafers, metal layers are about 1000 nm thick, while in LCD/TFT flat panels the thickness of the metal is only 100 nm thick. As a result of thin film thickness difference, what would be minor corrosion and etching of the metal layer for integrated circuits (for example a 50 nm etching) may not affect the yield, but would cause major defect and failure in FPDs.

The flat display panels are normally larger in size than typical silicon wafers. As a result, the processing equipment needed for fabrication of the flat panels is different and the chemical usage for cleaning those panels is much higher than seimiconductor IC manufacturing. The amount of chemical consumption needs to be economically feasible for the FPD industry.

In IC manufacturing, multiple chips are fabricated on a single wafer and when there is a failure on some areas of the wafer, the other areas are still useful. The yield depends on the number of good dies (chips) vs. bad ones on a wafer. However, in FPDs a small defect can cause the failure of an entire panel, which acts as a single device. Therefore, FPD manufacturing requires specialty chemical formulations and finer quality control.

In FPD processing with wet and dry photresist etching, a side wall polymer of cross-linked organo-metallic polymer can be formed around the metallized area of the panel. Removing these side wall polymers without attacking the metal layers requires formulations with particular corrosion inhibitors that are different than conventional alkaline strippers. These stripping compositions remove the photoresist polymers but can damage corrosion sensitive metals.

Because glass substrates cannot tolerate high temperatures like silicon wafers, the adhesion of thin films on glass panels poses a challenge to FPD manufacturing industry. Even small amount of residues can adversely affect the quality of thin films and pose a serious yield loss due to de-cohesion and delamination.

Due to processing limitations, thin films deposited on glass are under higher tensile and compressive stress in comparison to silicon wafers. Chemicals must be formulated to be compatible with stressed thin films to avoid failures.

SUMMARY OF THE INVENTION

It is a primary object of the present invention to provide an effective stripping composition for positive photoresist which is water based, non-halogenated, non-phenolic and non-alkaline.

Another object of the present invention is to provide a composition and method for removal of photoresist which is highly effective for removing photoresist from a substrate at low temperatures.

A further object of the present invention is to provide a photoresist removal composition which causes minimal corrosion to substrates and metal films.

Briefly, the preferred embodiments of the present invention utilizes a mixture of a dibasic ester (DBE), an alcohol, a polar organic solvent, and water to remove photoresist from a flat panel substrate. The process is effective at low temperature.

DETAILED DESCRIPTION OF THE PREFERRED EMBODIMENT a. Integrated Circuit Processing. This invention provides a process for stripping photoresist from a substrate, even if the photoresist has been baked and exposed to short wavelength hardening radiation. The composition and method are effective at ambient temperature (20° C. to 40° C.), and a synergistic effect enhancing the effectiveness of the stripper is noted when a mixture comprising water, a dibasic ester, and an alcohol is used. The stripping composition is comprised of:

(a) from 5% to 95% by weight of a dibasic ester (or mixture of such ethers) having the general formula:

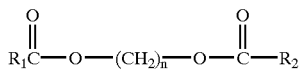

in which n is an integer from 1 to 5, and $R_1$ and $R_2$ are alkyl groups of 1 to 4 carbons;

(b) from 1% to 65% by weight of tetrahydrofurfuryl alcohol or a water soluble alcohol, glycol, or glycol ether compound having the general formula $R-(CHOH)_n-R'$ where R and R' denote hydrogen atoms, or alkyl groups of 1 to 7 carbons, or alkoxyl groups of 1 to 4 carbons, and n=1–3 (higher boiling alcohols, glycols, etc. are preferred if processing will occur at elevated temperatures); and (c) from 5% to 60% by weight deionized water. Other ingredients such as wetting agents, surfactants, dyes or colorants may be added to the stripping composition for specific applications.

It is more preferred that the photoresist stripper composition contain from 15%–85% by weight of the dibasic ester, from 10%–80% by weight of the alcohol/glycol/glycol ether and from 5%–60% by weight deionized water. It is yet more preferred that the photoresist stripper composition contain from 25%–75% by weight of the dibasic ester, from 20%–70% by weight of the alcohol/glycol/glycol ether and from 25%–55% by weight deionized water. In its most preferred embodiment, the photoresist stripper composition comprises from 25%–50% by weight of the dibasic ester, from 30%–50% by weight of the alcohol/glycol/glycol ether and from 25%–55% by weight deionized water.

As discussed below, the performance of the stripper of the present invention is enhanced when the combination of dibasic ester, alcohol/glycol/glycol ether, and water is used. The chemical nature of this synergistic effect is not known. However, dibasic ethers are generally not soluble in water, and the alcohol/glycol/glycol ether component allows creation of a single phase mixture. Thus, the percentages of the components may be adjusted, but should be within ranges where a single phase mixture is obtained. The percentages of the components (and the particular dibasic esters and alcohol/glycol/glycol ether components), strip time, and strip temperature can be adjusted to address particular photoresist stripping requirements.

The stripping compositions of the present invention are more effective even at ambient temperatures than prior art strippers, significantly less toxic (non-phenolic, non-halogenated, and easily biodegradable), and significantly less corrosive to sensitive metals than other known organic stripping solutions (because the present compositions are non-alkaline and non-acidic in aqueous solution, having a nearly neutral pH value). In a addition, the compositions have no flash point because of their water content, and are therefore safer than any other commercially available organic photoresist strippers.

It is also found that the stripper waste solution can be recycled for disposal of the organic waste by dilution of the mixture with addition of more deionized water. When more water is added to the waste solution (typically on the order of 30% more water by weight), the solution separates into an aqueous phase and an organic phase, with stripped photoresist segregated into the organic phase. A separatory funnel may be used to segregate the aqueous and organic phases. Thus, the organic portion with the stripped photoresist is easily separated. It may then be incinerated or otherwise disposed of with little difficulty.

Examples of suitable dibasic esters are dimethyl adipate,

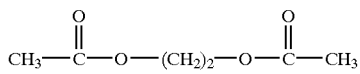

dimethyl glutarate,

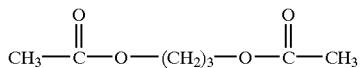

and dimethyl succinate:

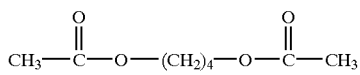

Mixtures of such esters may also be utilized. Suitable alcohols are ethanol, methanol, 2-propanol, n-propanol, n-butanol, n-pentanol, n-hexanol, n-heptanol, tetrahydrofurfuryl alcohol, ethylene glycol, propylene glycol, and glycol derivatives such as ethylene glycol and propylene glycol ethers.

The following test data demonstrate the synergistic effect of a composition including a dibasic ester, an alcohol, and water. In general, dibasic esters are insoluble or only slightly soluble in water. The use of an alcohol allows creation of a solution in which a dibasic ester and water may be mixed to create a homogenous solution.

Table 1 illustrates the stripping effect when a wafer coated with photoresist is stripped using a dibasic ester by itself. Wafers were prepared by conventional methods using three different positive photoresists: Shipley 1400 series (Shipley Company, Inc.), KTI-820 (OCG Chemicals), and AZ-1500 series (American Hoechst). Wafers were coated with photoresist, prebaked at 60° C., exposed to UV radiation, post-baked at 120° C., and then stripped at ambient temperature (26° C.) using the test solvents in Table 1. The stripping test was conducted by immersing the wafer in the solvent bath for 5 minutes with frequent agitation. The wafer was then removed, rinsed with deionized water, spin-dried, and tested for photoresist residue.

TABLE 1

| Solvent | Shipley-601 | KTI-820 | AZ-4110 |
| --- | --- | --- | --- |
| | (Percent of Photoresist Removed) | | |
| Dimethyl Succinate | 45% | 40% | 25% |
| Dimethyl Glutarate | 30–35% | 15–20% | 15–20% |
| Dimethyl Adipate | 35–40% | 15–20% | 10–15% |
| DMES Mixed* | 60–65% | 55–60% | 25–40% |

*DMES Mixed denotes dimethyl aliphatic esters (dibasic esters manufactured by Dupont). DMES Mixed is comprised of the following esters (by weight percentage): dimethyl succinate 17%, dimethyl adipate 17%, dimethyl glutarate 66%.

Table 1 shows that DBEs by themselves are unsatisfactory stripping agents.

Table 2 illustrates results achieved with a 1:1:1 by volume ratio mixture of dimethyl adipate, dimethyl glutarate, and dimethyl succinate mixed with an alcohol at 50% by weight. Wafers were baked at 150° C. and stripping time was 5 minutes at 25° C. Wafer cleanliness was rated from 1 to 10, where 1 indicates 90% residue, 5 indicates 50% residue, and 10 indicates 0% residue (100% clean).

TABLE 2

| ALCOHOL USED | SHIPLEY-601 | KTI-820 | AZ-411O |
|---|---|---|---|
| Ethanol | 7 | 8 | 6 |
| Isopropanol | 6 | 7 | 5 |
| n-Propanol | 7 | 8 | 6 |
| n-Butanol | 5 | 6 | 4 |
| Tetrahydrofurfuryl alcohol | 4 | 5 | 4 |

Table 2 indicates a slightly enhanced performance over the results of Table 1, but still unacceptable performance as a photoresist stripper.

Table 3 illustrates stripping results achieved with a mixture of (a) from 30% to 40% by weight of a dibasic ester mixture (1:1:1 ratio by weight of dimethyl adipate, dimethyl glutarate, and dimethyl succinate (this mixture is identified as DBE1:1:1 in Tables 3 and 5); (b) 20% to 30% alcohol by weight; and (c) 35% to 50% deionized water by weight. The wafers used were baked at 120° C. and a stripping time of 5 minutes at 25° C. was used. Wafer cleanliness was rated from 1 to 10.

TABLE 3

| COMPOSITION | SHIPLEY-601 | KTI-820 | AZ-4110 |
|---|---|---|---|
| 1. 30% DBE1:1:1<br>20% Ethanol<br>50% Water | 8 | 10 | 8 |
| 2. 30% DBE1:1:1<br>30% Isopropanol<br>40% Water | 8 | 10 | 9 |
| 3. 30% DBE1:1:1<br>30% n-butanol<br>40% Water | 10 | 10 | 10 |
| 4 35% DBE1:1:1<br>30% Tetrahydrofurfuryl alcohol<br>35% Water | 10 | 10 | 10 |

Table 3 indicates that even at ambient temperature, exceptional photoresist removal is achieved.

Table 4 illustrates the reduced corrosive effect of the stripper of the present invention on a sensitive metal substrate compared to conventional positive photoresist strippers. Three major strippers which are presently widely used in the semiconductor industry (PRS-3000 (J. T. Baker, Stripper P), EKC 830 Posistrip (Stripper E), and ACT-100 (Stripper A)) were selected and compared with a formulation in accordance with the present invention (specifically, composition 4 shown in Table 3). Silicon wafers coated by 100% copper (Substrate 1), 4% copper in aluminum (Substrate 2), 100% aluminum (Substrate 3), and 100% aluminum oxide on aluminum (Substrate 4) were used as test wafers. The wafers were emersed in a strip bath containing 95 ml of stripper and 5 ml deionized water, and heated to 75 to 80° C., for 30 minutes. The etched portion of the metal substrate dissolved into the stripping solution was measured and tested using Furnace Atomic Absorption AA/GF spectrophotometry method and inductively coupled plasma emission (ICP) spectroscopy methods to determine metal dissolved in the stripper.

TABLE 4

| SUB-STRATE | STRIPPER P<br>>11.5 | STRIPPER E<br>pH:<br>>11.5 | STRIPPER A<br>11–11.5 | COMP. 4<br>OF<br>TABLE 3<br>6–6.5 |
|---|---|---|---|---|
| 1 | >30% etched | >25% etched | >25% etched | no corrosion |
| 2 | 2–5% etched | 2–5% etched | 2–5% etched | no corrosion |
| 3 | 1–2% etched | 1–2% etched | 1–2% etched | no corrosion |
| 4 | 5–10% etched | 5–10% etched | 5–10% etched | no corrosion |

The following examples show the effectiveness of compositions of the present invention in stripping positive photoresists. Wafers coated with AZ-4110 photoresist were baked in an oven at 150° C. for 30 minutes. After baking, the wafers were emersed in the stripping solution were frequent agitation for 3 to 5 minutes. The stripped wafers then were removed and rinsed for 30 to 45 seconds with deionized water and blow dried with nitrogen gas. The minimum stripping time for each composition time for each was recorded. The surface of each stripped wafer was then tested for possible resist residue using scanning electron microscopy (SEM). The stripping was conducted at 28° C.

TABLE 5

| EXAMPLE | DBE COMPOUND<br>(% WEIGHT) | ALCOHOL<br>(% WEIGHT) | PHOTO-RESIST RESIDUE | STRIP TIME |
|---|---|---|---|---|
| 1 | Dimethyl Succinate (30%) | Ethanol (15%) | None | <1 min. |
| 2 | Dimethyl Adipate (30%) | Isopropanol (15%) | None | 1–2 min |
| 3 | Dimethyl Glutarate (30%) | n-Propanol (20%) | None | <1 min. |
| 4 | DBE1:1:1 (36%) | n-Butanol (20%) | None | <1 min. |
| 5 | DBES Mixed (36%) | n-Propanol (25%) | None | <1 min. |

Note: For all mixtures, the balance was deionized water.

In practicing the method of the present invention, the substrate (usually a silicon wafer) and photoresist are contacted with the photoresist stripper solution at ambient temperature for a stripping time sufficient to remove the photoresist from the substrate. Elevated temperature (60° C. to 80° C.) may be used for particularly difficult to remove resist, and at such temperatures a higher boiling alcohol should be used. The stripping time at ambient temperature (25° C.) is generally approximately 2–3 minutes.

b. Flat Panel Displays.

The method for removing photoresist from flat panel displays is similar to that for semiconductor wafers, with the addition of a polar organic solvent. LCD/TFT panels were patterned and metalized with techniques known in the art, coated with positive photoresist, baked on a hot plate, and hard baked in an oven using conventional methods. An immersion bath of the present formulation was heated to 50–70° C. The panels were placed in the bath and stripped to complete removal of the resist material. The stripping composition is comprised of:

(a) from 5% to 95% by weight DBE (as discussed above for the IC formulation);

(b) from 1% to 65% by weight alcohol/glycol/glycolether (as discussed above for the IC formulation);

(c) from 5% to 70% by weight of a polar organic solvent or mixtures thereof selected from dimethyl sulfoxide (DMSO), n-hydroxyethyl-pyrrolidinone (HEP), n-methyl pyrrolidinone (NMP), other pyrrolidinones, tetramethylsulfone (sulfolane), or other alkyl sulfoxide or sulfone compounds; and (d) from 5% to 60% by weight deoinized water.

It is most preferred that the composition contain from 20% to 40% DBE, 20% to 40% alcohol/glycol/ether, 20% to 50% polar organic solvent, and 10% to 30% water.

Addition of a mild organic amine or amide to the present composition, with a corrosion inhibitor will enhance the stripping capability while keeping the corrosion and etch rate of the sensitive soft metals at minimum. When an amine or amide is added, it is preferably added to the composition described above (which constitutes 30% to 60% of the total, with the remainder as added amine/amide (20% to 40%) and water (10% to 25%).

Test Conditions. A mother glass of 650 mm×550 mm was cleaned with an aqueous surfactant and dried with high purity air or inert gas such as nitrogen. A thin film (200 nm) of indium tin oxide (ITO) was sputtered on the glass. The ITO was annealed to obtain desired physical and electrical characteristics. For the photoresist stripping test, no surface preparation was applied to prior to resist application. A thin film of 3–5 microns positive photoresist (AZ-4000) was applied via spin or roller coating (meniscus or extrusion coating). Resist coating was done on an in-line or cluster track system equipped with hot plate bake modules for soft baking of the resist. The coated photoresist was soft baked at 100–120° C. for 1–5 minutes for removing excess solvents from the resist and preparing it for thru-the-mask UV exposure. The coated resist was then exposed to UV radiation and developed, leaving a pattern of unexposed photoresist. Panels were developed with a diluted (0.25 N) solution of TMAH (tetramethylammonium hydroxide) by spraying method. Developed panels were rinsed with DI water and dried with high purity air or nitrogen. Panels were inspected for pattern integrity. Accepted panels were then hard baked at about 120–130° C. Etching was done by conventional wet chemistry etching methods. Etched panels were inspected for etching completeness and accepted panels were used for the final resist stripping process and stripper composition evaluation tests.

Table 6 illustrates flat panel display photoresist removal with DBE 1:1:1, 2-methylpropanediol (MP-Diol), DMSO, and water. (Percentages are shown by weight.)

TABLE 6

| | DBE 1:1:1 | MP-Diol | DMSO | Water | Results |
|---|---|---|---|---|---|
| 1. | 25% | 25% | 25% | 25% | Cleaned in 12 min. @ 70° C. |
| 2. | 25 | 25 | 30 | 20 | 10 min. |
| 3. | 25 | 20 | 35 | 20 | 8 min. |
| 4. | 20 | 25 | 40 | 15 | 6 min. |
| 5. | 25 | 20 | 45 | 10 | 6 min. |

Table 7 illustrates stripping results with DBE 1:1:1, glycol ether DPM (Dawanol DPM), DMSO, and water.

TABLE 7

| | DBE 1:1:1 | DPM | DMSO | Water | Results |
|---|---|---|---|---|---|
| 1. | 25% | 25% | 25% | 25% | Cleaned in 8 min. @ 65° C. |

TABLE 7-continued

| | DBE 1:1:1 | DPM | DMSO | Water | Results |
|---|---|---|---|---|---|
| 2. | 25 | 25 | 30 | 20 | 7 min. |
| 3. | 25 | 20 | 35 | 20 | 6 min. |
| 4. | 20 | 25 | 40 | 15 | 5 min. |
| 5. | 25 | 20 | 45 | 10 | 5 min. |

Table 8 illustrates stripping results with DBE 1:1:1, glycol ether DPM (Dawanol DPM), sulfolane, and water.

TABLE 8

| | DBE 1:1:1 | DPM | SULFOLANE | Water | Results |
|---|---|---|---|---|---|
| 1. | 25% | 25% | 25% | 25% | Cleaned in 10 min. @ 60° C. |
| 2. | 25 | 25 | 30 | 20 | 9 min. |
| 3. | 25 | 20 | 35 | 20 | 8 min. |
| 4. | 20 | 25 | 40 | 15 | 8 min. |
| 5. | 25 | 20 | 45 | 10 | 7 min. |

Table 9 illustrates stripping results with DBE 1:1:1, glycol ether DPM (Dawanol DPM), HEP, and water.

TABLE 9

| | DBE 1:1:1 | DPM | HEP | Water | Results |
|---|---|---|---|---|---|
| 1. | 25% | 25% | 25% | 25% | Cleaned in 12 min. @ 60° C. |
| 2. | 25 | 25 | 30 | 20 | 10 min. |
| 3. | 25 | 20 | 35 | 20 | 10 min. |
| 4. | 20 | 25 | 40 | 15 | 8 min. |
| 5. | 25 | 20 | 45 | 10 | 8 min. |

Table 10 illustrates stripping results using the preferred formulations from Tables 6 through 9 (6-5, 7-4, 8-5, 8-4, and 9-4) mixed with organic amines used in resist stripping applications.

TABLE 10*

| Composition | Results |
|---|---|
| 1. 6-5 plus 25% MEA and 25% water (12.5% DBE 1:1:1, 10% MP-Diol, 22.5% DMSO, 25% MEA, 30% water) | Cleaned in 2 min. @ 60° C.; no corrosion |
| 2. 7-4 plus 30% MIPA and 20% water (10% DBE 1:1:1, 12.5% DPM, 20% DMSO, 30% MIPA, 27.5% water) | 2 min. @ 65° C.; no corrosion |
| 3. 8-5 plus 35% AEEA and 20% water (11.25% DBE 1:1:1, 9% DPM, 20.25% sulfolane, 35% AEEA, 24.5% water) | 3 min. @ 65° C.; no corrosion |
| 4. 8-4 plus 40% DGA and 15% water (9% DBE 1:1:1, 11.25% DPM, 18% sulfolane, 40% DGA, 21.75% water) | 3 min. @ 65° C.; no corrosion |
| 5. 9-4 plus 45% MIPA and 10% water (9% DBE 1:1:1, 11.25% DPM, 18% HEP, 45% MIPA, 16.75% water) | 2 min. @ 65° C.; no corrosion |

*MEA (monoethanolomaine);
MIPA (monoisopropanolamine);
AEEA aminoethylethanolomine);
DGA (diglycolamine).

Table 11 shows the results of corrosion studies on different thin films deposited on glass panels. All tests were conducted at 75 C. for 30 minutes, soaking the panels in the stripper followed by a DI water rinse and nitrogen blow drying process.

TABLE 11

(Thin Film Corrosion Tests)

| Stripper Composition used. | ITO | Mo | Al/Cu | W | Cr |
|---|---|---|---|---|---|
| 6-3 | Poor | Poor | Fair | Poor | Good |
| 7-4 | Good | Fair | Good | Fair | Good |
| 8-4 | Good | Fair | Good | Fair | Good |
| 9-1 with inhibitor I* | Good | Good | Good | Good | Good |
| 9-1 with Inhibitor II* | Good | Good | Good | Good | Good |
| 8-2 with Inhibitor I* | Good | Good | Excellent | Good | Good |
| 8-2 with Inhibitor II* | Good | Good | Good | Good | Good |

*Inhibitor I is TBC (tert-butylcatechol);
Inhibitor II is BTA (Benzotriazole)

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method for removing photoresist from a substrate comprising contacting said substrate with a stripping solution for a time sufficient to remove said photoresist from said substrate, said stripping solution consisting essentially of:

(a) from about 5% to about 95% by weight of one or more dibasic esters having the general formula:

$$R_1CO_2-(CH_2)_n-CO_2R_2$$

where $R_1$ and $R_2$ are alkyl groups of 1–4 carbons and n =1–5;

(b) from about 1% to about 65% by weight of tetrahydrofurfuryl alcohol or a water soluble alcohol, glycol, glycol ether, or mixtures thereof having the general formula:

$$R-(CHOH)_n-R'$$

where R and R' are selected from the group consisting of a hydrogen atom, an alkyl group of 1 to 7 carbon atoms, and an alkoxyl group of 1 to 4 carbon atoms, n=1–3;

(c) from about 5% to about 70% by weight of an organic solvent selected from the group consisting of dimethyl sulfoxide, n-hydroxethyl-pyrrolidinone, n-methyl pyrrolidinone, sulfolane, and mixtures thereof; and (d) from about 5% to about 60% by weight of deionized water.

2. The method of claim 1 where the dibasic ester is present in an amount of from about 25% to about 50% by weight.

3. The method of claim 1 where the water soluble alcohol, glycol, glycol ether, or mixture thereof, is present in an amount of from about 30% to about 50% by weight.

4. The method of claim 1, where the organic solvent, or mixture thereof, is present in an amount of from about 20% to about 50% by weight.

5. The method of claim 1 where the deionized water is present in an amount of from about 25% to about 55% by weight.

6. The method of claim 1 where the dibasic ester is selected from the group consisting of dimethyl adipate, dimethyl glutarate and dimethyl succinate.

7. The method of claim 1 where the water soluble alcohol is selected from the group consisting of ethanol, methanol, 2-propanol, n-propanol, n-butanol, n-pentanol, n-hexanol, and n-heptanol.

8. The method of claim 1 where the glycol or glycol ether is selected from the group consisting of ethylene glycol, propylene glycol, ethylene glycol ethers, and propylene glycol ethers.

9. The method of claim 1 where (a) the dibasic esters are present in an amount of from about 25% to about 50% by weight, and are selected from the group consisting of dimethyl adipate, dimethyl glutarate and dimethyl succinate;

(b) the alcohol, glycol, glycol ether, or mixture thereof is present in an amount of from about 30% to about 50% by weight, and are selected from the group consisting of ethanol, methanol, 2-propanol, n-propanol, n-butanol, n-pentanol, n-hexanol, n-heptanol, tetrahydrofurfuryl alcohol, ethylene glycol, propylene glycol, ethylene glycol ethers, and propylene glycol ethers;

(c) the organic solvent, or mixture thereof, is present in an amount of from about 20% to about 50% by weight; and (d) the deionized water is present in an amount of from about 25% to about 55% by weight.

10. A method of removing photoresist from a substrate comprising contacting said substrate with a stripping solution for a time sufficient to remove said photoresist from said substrate, wherein said stripping solution consists essentially of:

(a) from about 2% to about 45% by weight of one or more dibasic esters having the general formula:

$$R_1CO_2-(CH_2)_n-CO_2R_2$$

where $R_1$ and $R_2$ are alkyl groups of 1–4 carbons and n=1–5;

(b) from about 1% to about 40% by weight of tetrahydrofurfuryl alcohol or a water soluble alcohol, glycol, glycol ether, or mixtures thereof having the general formula:

$$R-(CHOH)_n-R'$$

where R and R' are selected from the group consisting of a hydrogen atom, an alkyl group of 1 to 7 carbon atoms, and an alkoxyl group of 1 to 4 carbon atoms, n=1–3;

(c) from about 2% to about 35% by weight of an organic solvent selected from the group consisting of dimethyl sulfoxide, n-hydroxethyl-pyrrolidinone, n-methyl pyrrolidinone, sulfolane, and mixtures thereof; and (d) from about 5% to about 60% by weight deionized water; and (e) from about 5% to about 60% by weight of an amine selected from the group consisting of monoethanolamine, monoisopropanolamine, aminoethylethanolamine, diglycolamine, and mixtures thereof.

* * * * *